United States Patent [19]

Marchand

[11] Patent Number: 5,680,067
[45] Date of Patent: Oct. 21, 1997

[54] FREQUENCY DIVIDING DEVICE

[75] Inventor: Philippe Marchand, Paris, France

[73] Assignee: U.S. Philips Corporation, New York, N.Y.

[21] Appl. No.: 559,780

[22] Filed: Nov. 15, 1995

[30] Foreign Application Priority Data

Nov. 30, 1994 [FR] France .................. 94 14374

[51] Int. Cl.$^6$ .................. H03B 21/00; H03L 7/18
[52] U.S. Cl. .................. 327/117; 377/47
[58] Field of Search .................. 327/113, 115, 327/117, 118, 165, 167, 172, 174; 377/47, 48; 331/37–40, 42, 43, 47, 48

[56] References Cited

U.S. PATENT DOCUMENTS

| | | | |
|---|---|---|---|
| 3,235,815 | 2/1966 | Keicher | 331/39 |
| 3,694,766 | 9/1972 | Boelke | 331/40 |
| 3,878,476 | 4/1975 | Honore et al. | 331/40 |
| 4,008,443 | 2/1977 | Remy | 331/40 |
| 4,206,421 | 6/1980 | Bernhard et al. | 331/42 |
| 4,327,336 | 4/1982 | Cornish et al. | 327/117 |
| 4,461,022 | 7/1984 | Slagley | 327/117 |
| 4,488,123 | 12/1984 | Kurihara | 327/117 |
| 4,725,786 | 2/1988 | Papaieck | 328/14 |
| 4,916,411 | 4/1990 | Lymer | 331/40 |

*Primary Examiner*—Timothy P. Callahan
*Assistant Examiner*—Eunja Shin

[57] ABSTRACT

This frequency dividing device has an input terminal for a signal to be divided and an output terminal for an output signal. It further comprises: a first mixing circuit which is particularly of the sub-harmonic type, has a first input which forms the input terminal, and a second input for receiving a signal from a local oscillator; a first dividing circuit for dividing the output signal of the first mixing circuit; a second dividing circuit for dividing the output signal of the local oscillator; and a second mixing circuit which has a first input for receiving the output signal of the first dividing circuit, and a second input for receiving the output signal of the second dividing circuit, and an output which forms the output terminal.

7 Claims, 1 Drawing Sheet

FREQUENCY DIVIDING DEVICE

BACKGROUND OF THE INVENTION

The present invention relates to a frequency dividing device which has an input terminal for a signal to be divided and an output terminal for a signal of lower frequency, whose frequency is equal to part of the signal frequency to be divided.

This device finds important applications especially in the high-frequency domain, for example, of the order of a hundred GHz.

At these frequencies it is very difficult to perform a direct frequency division.

SUMMARY OF THE INVENTION

The present invention proposes a device of the type defined in the opening paragraph which is satisfactory as regards the output frequency, which gives a good indication of the fact that the input frequency may be very high.

Therefore, such a device is characterized in that it comprises:

- a first mixing circuit which is particularly of the sub-harmonic type, has a first input which forms the input terminal, and a second input for receiving a signal from a local oscillator,
- a first dividing circuit for dividing the output signal of the first mixing circuit,
- a second dividing circuit for dividing the output signal of the local oscillator,
- a second mixing circuit which has a first input for receiving the output signal of the first dividing circuit, and a second input for receiving the output signal of the second dividing circuit, and an output which forms the output terminal.

These and other aspects of the invention will be apparent from and elucidated with reference to the embodiments described hereinafter.

DESCRIPTION OF PREFERRED EMBODIMENTS

Figure 1:
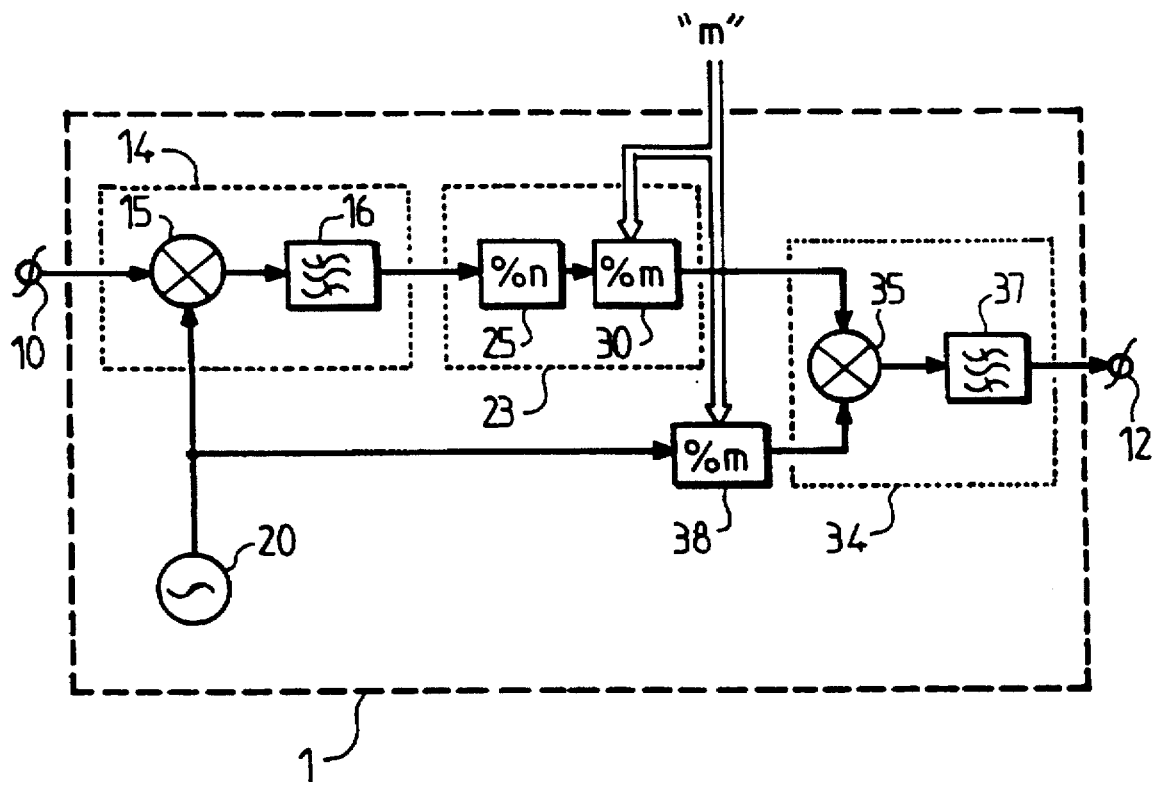
FIG. 1 shows a dividing device according to the invention.

The device according to the invention is referenced 1 in FIG. 1. It has an input terminal 10 to which is applied a [high-frequency] signal with a high frequency whose magnitude [value] is, for example F=108 GHz. On an output terminal 12 there appears a signal whose frequency FS has a value that is "k" times lower. For dividing the frequency of such a signal it is impossible to use digital frequency dividing circuits, even manufactured in high-speed technology.

To obtain this frequency division, according to the invention a first mixing circuit 14 of the sub-harmonic type is used of which a first input is connected to terminal 10 and which produces on its output a signal having frequency: $F - p \cdot f_o$, where $f_o$ is the frequency of a local oscillator 20 whose output is connected to a second input of the mixing circuit 14, and p is an integer defining the rank of the sub-harmonic mixer.

This mixing circuit 14 of the sub-harmonic type is diagrammatically shown in the drawing Figure by a mixer 15 which is followed by a bandpass filter 16. A description of a sub-harmonic mixer will be found in the following article: "Harmonically Pumped Stripline Down-Converter" by Martin V. Schneider and William W. Snell Jr., published in the journal IEEE TRANSACTIONS ON MICROWAVE THEORY AND TECHNIQUES, Vol. MTT-23, No. 3, March 1975, pp. 271 to 275.

As the frequency has now been lowered [nowadays], it is possible to use dividing circuits of the digital type, but they have a relatively high operating speed. The first dividing circuit 23 formed by the dividers 25 and 30 which divide the frequency of the output signal of filter 16 by "n" and "m", respectively. The divider 30 is a programmable divider that makes it possible to vary the output frequency FS in a simple manner. A second mixing circuit 34 is formed actually by a mixer 35 and a bandpass filter 37. An input of this circuit 34 is connected to the output of the divider 30 and a second input is connected to the output of a second dividing circuit 38. This circuit 34 produces a signal whose frequency is the sum of the frequencies of the signals applied to its inputs. The input of this second dividing circuit 38, preferably of a programmable type, is connected to the output of the oscillator 20.

Summarizing, the frequency F1 of the signal applied to the first input of the mixing circuit 34 is such that:

$$F1 = \frac{F - p \cdot f_o}{m \cdot n}$$

The frequency F2 of the signal applied to the second input of the mixing circuit is such that:

$$F2 = \frac{f_o}{m}$$

The output frequency FS of the dividing circuit is written as:

$$FS = F1 + F2 = \frac{F - p \cdot f_o}{m \cdot n} + \frac{f_o}{m} = \frac{F}{m \cdot n} + f_o \left( \frac{1}{m} - \frac{p}{m \cdot n} \right)$$

by selecting n=p, the following is obtained:

$$FS = \frac{F}{m \cdot n} = \frac{F}{k}$$

Thus, the output frequency FS no longer depends on the frequency of the local oscillator.

It is possible to make the output frequency vary by correlatively influencing the divider 30 and dividing circuit 38. By way of example:

F=108 GHz
$f_o$=10 GHz
p=n=4 where m=16, the frequency Fs=1.6875 GHz.

Figure 2:
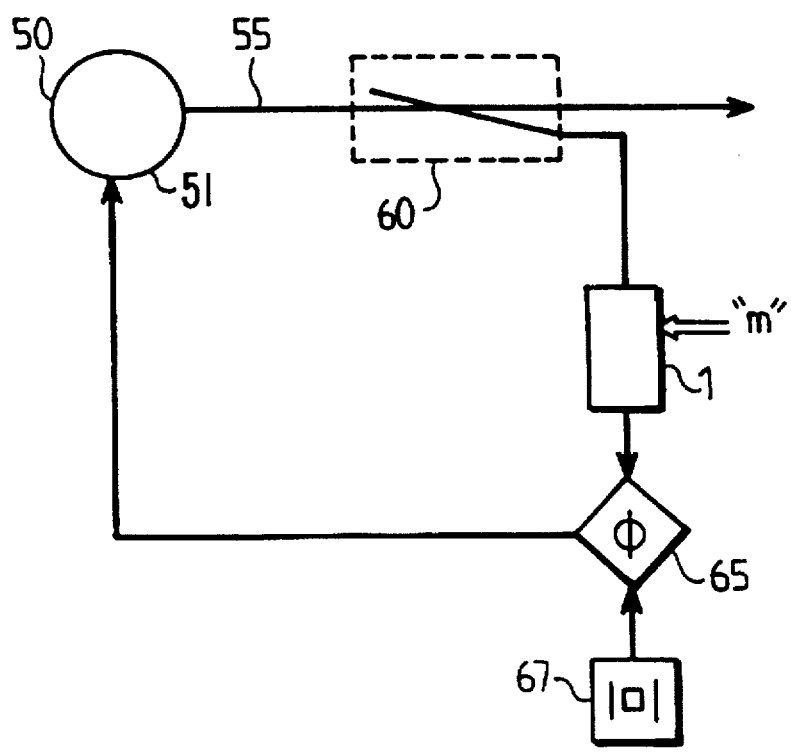
FIG. 2 shows a frequency control circuit utilizing the dividing device according to the invention.

FIG. 2 shows an example of an application of such a dividing device 1. This device makes it possible to control the frequency of a microwave backward wave oscillator. This type of oscillator allows of a frequency control in that a voltage applied to a control input 51 is caused to vary. The microwave generated by this oscillator 50 is transmitted by a waveguide 55 in whose path is arranged a coupler 60. This coupler derives a part of the transmitted wave and transmits same to the input of the device 1 according to the invention. The output of the device is connected to a first input of a phase detector 65 which receives on a second input the output signal of a reference oscillator formed by a crystal oscillator 67. The comparing signal of this phase detector is applied to the control input 51.

What is claimed is:

1. A circuit with a frequency dividing device which has an input terminal for receipt of a signal with an input frequency that is to be divided and an output terminal for supplying a signal of an output frequency lower than the input frequency, the frequency dividing device comprising:

a first mixing circuit, having a first input which forms the input terminal, and a second input for receiving a reference signal with a reference frequency for mixing the input signal and the reference signal, a first dividing circuit coupled to an output of the first mixing circuit for dividing a frequency of an output signal of the first mixing circuit, a second dividing circuit coupled to the second input of the first mixing circuit for dividing the reference frequency;

a second mixing circuit which has a first input coupled to an output of the first divider circuit for receiving an output signal of the first dividing circuit, and a second input coupled to an output of the second divider circuit for receiving an output signal of the second dividing circuit, for mixing an output signal of the first dividing circuit and an output signal of the second dividing circuit, the second mixing circuit having an output coupled to the output terminal, wherein:

a first dividing factor of the first dividing circuit and a second dividing factor of the second dividing circuit are set so that the output frequency is independent of the reference frequency.

2. The circuit of claim 1, wherein the first mixing circuit comprises a sub-harmonic mixer of a particular rank.

3. A frequency synthesizer of a phase locked loop type comprising a frequency control oscillator, a frequency dividing device, and a phase detector for comparing an output signal of the dividing device with a reference signal and for producing a control signal for said frequency control oscillator, the frequency dividing device including an input terminal for receipt of a signal with an input frequency that is to be divided and an output terminal for supplying a signal of an output frequency lower than the input frequency, the frequency dividing device comprising:

a first mixing circuit, having a first input which forms the input terminal, and a second input for receiving a reference signal with a reference frequency for mixing the input signal and the reference signal, a first dividing circuit coupled to an output of the first mixing circuit for dividing a frequency of an output signal of the first mixing circuit, a second dividing circuit coupled to the second input of the first mixing circuit for dividing the reference frequency;

a second mixing circuit which has a first input coupled to an output of the first divider circuit for receiving an output signal of the first dividing circuit, and a second input coupled to an output of the second divider circuit for receiving an output signal of the second dividing circuit, for mixing an output signal of the first dividing circuit and an output signal of the second dividing circuit, the second mixing circuit having an output coupled to the output terminal, wherein:

a first dividing factor of the first dividing circuit and a second dividing factor of the second dividing circuit are set so that the output frequency is independent of the reference frequency.

4. The frequency synthesizer of claim 3, wherein the first mixing circuit comprises a sub-harmonic mixer of a particular rank.

5. The circuit of claim 2, wherein:

the first dividing circuit functionally comprises a series arrangement of a first divider and a second divider;

the second dividing circuit comprises a third divider;

the first and third divider have equal dividing factors;

the particular rank of the sub-harmonic mixer is equal to a further dividing factor of the second divider.

6. The circuit of claim 7, wherein the dividing factors of the first and third dividers are programmable.

7. A method of processing an input signal with an input frequency, the method comprising dividing the input frequency and supplying an output signal with an output frequency lower than the input frequency, the dividing comprising:

mixing the input signal with a reference signal that has a reference frequency for producing a first mixed signal;

providing a first divided signal comprising dividing a frequency of the first mixed signal;

providing a second divided signal comprising dividing the reference frequency;

mixing the first and second divided signals and producing the output signal;

wherein:

a first dividing factor of the first dividing and a second dividing factor of the second dividing have magnitudes so that the output frequency is independent of the reference frequency.

* * * * *